(12) United States Patent
Li

(10) Patent No.: US 7,935,639 B2
(45) Date of Patent: May 3, 2011

(54) PROCESS FOR INCREASING FEATURE DENSITY DURING THE MANUFACTURE OF A SEMICONDUCTOR DEVICE

(75) Inventor: Mingtao Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/757,898

(22) Filed: Apr. 9, 2010

(65) Prior Publication Data

US 2010/0203740 A1    Aug. 12, 2010

Related U.S. Application Data

(62) Division of application No. 11/263,885, filed on Nov. 1, 2005, now Pat. No. 7,696,101.

(51) Int. Cl.
*H01L 21/461* (2006.01)
(52) U.S. Cl. ........ 438/736; 438/694; 438/725; 438/947; 257/E21.035; 257/E21.038
(58) Field of Classification Search .................. 438/736, 438/947; 257/E21.035, E21.038
See application file for complete search history.

(56) References Cited

U.S. PATENT DOCUMENTS

| | | | |
|---|---|---|---|
| 4,473,435 A | 9/1984 | Zafiropoulo et al. | |
| 4,729,815 A | 3/1988 | Leung | |
| 5,254,218 A | 10/1993 | Roberts et al. | |
| 5,328,810 A | 7/1994 | Lowrey et al. | |
| 5,795,830 A | 8/1998 | Cronin et al. | |
| 5,998,256 A * | 12/1999 | Juengling | 438/253 |
| 6,638,441 B2 | 10/2003 | Chang et al. | |
| 6,916,746 B1 | 7/2005 | Hudson et al. | |
| 7,429,536 B2 * | 9/2008 | Abatchev et al. | 438/725 |
| 2005/0059262 A1 | 3/2005 | Yin et al. | |
| 2005/0136675 A1 | 6/2005 | Sandhu et al. | |

OTHER PUBLICATIONS

Kohler, M., "Etching in Microsystem Technology," 1999, Wiley-VCH, pp. 97-98.
Co-pending application: "Pitch Reduced Patterns Relative to Photolithography Features," U.S. Appl. No. 11/214,544, filed Aug. 29, 2005.
Co-pending application: "Method and Apparatus for Adjusting Feature Size and Position," U.S. Appl. No. 11/150,408, filed Jun. 9, 2005.
Co-pending Application: "Method for Integrated Circuit Fabrication Using Pitch Multiplication," U.S. Appl. No. 10/934,778, filed Sep. 2, 2004.

* cited by examiner

*Primary Examiner* — Matthew C Landau
*Assistant Examiner* — Vicki B Booker

(57) ABSTRACT

Methods used during the manufacture of a semiconductor device, such as one that includes forming a plurality of vertically oriented first support features. Each feature comprises first and second sidewalls and the first support features are formed to have a first pitch. A plurality of first mask spacers are formed, wherein one first mask spacer is formed on each first support feature sidewall, and each first mask spacer comprises an exposed, vertically oriented sidewall. A plurality of vertically oriented second support features are formed, wherein one second support feature is formed on the exposed, vertically oriented sidewall of each first mask spacer, and each second support feature is separated from an adjacent second support feature by a gap. A plurality of second mask features are formed, wherein one second mask feature is formed within each gap. The first and second support features are removed, and the first and second mask spacers are left to provide an etch pattern, wherein the first and second mask features have a second pitch. The first pitch is about three times the second pitch.

5 Claims, 10 Drawing Sheets

PROCESS FOR INCREASING FEATURE DENSITY DURING THE MANUFACTURE OF A SEMICONDUCTOR DEVICE

This application is a divisional of prior application Ser. No. 11/263,885, entitled "PROCESS FOR INCREASING FEATURE DENSITY DURING THE MANUFACTURE OF A SEMICONDUCTOR DEVICE", filed Nov. 1, 2005, now U.S. Pat. No. 7,696,101, the entire disclosure of which is hereby incorporated by reference.

FIELD OF THE INVENTION

This invention relates to the field of semiconductor manufacture and, more particularly, in one or more embodiments, to a method for forming features at a starting density with a lithography mask, and approximately tripling the final density through the use of various conformal layers and selective etches.

BACKGROUND OF THE INVENTION

During the formation of a semiconductor device, many features such as word lines, digit lines, contacts, and other features are commonly formed over a semiconductor wafer. A goal of semiconductor device engineers is to form as many of these features in a given area as possible to increase yields, decrease manufacturing costs, and to miniaturize devices. The formation of these structures on a semiconductor wafer typically requires lithography. Optical lithography, the lithographic method most used in leading-edge wafer processing, comprises projecting coherent light of a given wavelength, typically 248 nanometers (nm) or 193 nm, from an illumination source (illuminator) through a quartz photomask or reticle having a chrome pattern, and imaging that pattern onto a wafer coated with photoresist. The light chemically alters the photoresist and enables the exposed photoresist (if positive resist is used) or the unexposed photoresist (if negative resist is used) to be rinsed away using a developer.

With decreasing feature sizes, the limits of optical lithography are continually being tested. Improvements in feature density are made through process advances, enhanced lithographic methods referred to as resolution enhancement techniques, and improved equipment and materials.

One such process advance, depicted in FIGS. 1-6, uses a mask having repeating features of a given pitch (i.e. a given distance from the beginning of one repeating feature to the beginning of the next feature) along with the formation of various layers and selective etches to double the density of the features formed from the lithography mask. FIG. 1 depicts a semiconductor wafer substrate assembly 10 comprising a semiconductor wafer, a layer to be etched 12, for example a silicon nitride layer, a support layer 14, for example formed from carbon using chemical vapor deposition (CVD) or a spun-on technique, and a patterned masking layer 16, such as a photoresist layer formed using an optical lithographic process or a hard mask layer formed using optical lithography and an etch process. The patterned masking layer 16 may be formed at the limits allowed by the lithographic process, and comprises three individual features (three periods/pitches) formed over a given distance 18.

After forming the structure of FIG. 1, an etch of the support layer 14 is performed using mask 16 as a pattern. This etch is typically an anisotropic dry etch which etches the support layer 14 selective to the layer to be etched 12 (i.e. which removes the support layer 14 with little or no etching of the layer to be etched 12). After etching the support layer 14, the patterned masking layer 16 is removed and a conformal hard mask layer 20, for example silicon dioxide, is formed to result in the structure of FIG. 2.

Subsequently, a spacer etch of the FIG. 2 structure is performed to result in the structure of FIG. 3 having hard mask layer spacers 20 formed along sidewalls of the support layer 14. Subsequently, the support layer 14 is etched to result in the structure of FIG. 4.

Next, the hard mask layer 20 is used as a pattern to etch the layer to be etched 12, which results in the structure of FIG. 5. Finally, the hard mask layer 20 is etched selective to the layer to be etched 12 to result in the structure of FIG. 6.

The process of FIGS. 1-6 has the advantage of using optical lithography to form the masking layer 16 having three features in a given distance 18, while the completed structure depicted in FIG. 6 has six features 12 (six periods/pitches) in the original distance 18. Thus the number of features within the distance is approximately doubled without requiring an additional lithography mask.

Various techniques to increase feature density are described in U.S. Pat. No. 5,328,810 by Tyler A. Lowrey, et al. and U.S. Pat. No. 5,254,218 by Ceredig Roberts et al., both of which are assigned to Micron Technology, Inc. and incorporated herein as if set forth in their entirety.

A method for forming semiconductor device using an optical lithography mask with a first pitch and resulting in features having a second pitch which is less than half the first pitch would be desirable.

SUMMARY OF THE INVENTION

In one embodiment, a plurality of vertically oriented first support features are formed. Each feature comprises first and second sidewalls and the first support features are formed to have a first pitch. A plurality of first mask spacers are formed, wherein one first mask spacer is formed on each first support feature sidewall, and each first mask spacer comprises an exposed, vertically oriented sidewall. A plurality of vertically oriented second support features are formed, wherein one second support feature is formed on the exposed, vertically oriented sidewall of each first mask spacer, and each second support feature is separated from an adjacent second support feature by a gap. A plurality of second mask features are formed, wherein one second mask feature is formed within each gap. The first and second support features are removed, and the first and second mask spacers are left to provide an etch pattern, wherein the first and second mask features have a second pitch. The first pitch is about three times the second pitch.

Advantages will become apparent to those skilled in the art from the following detailed description read in conjunction with the appended claims and the drawings attached hereto.

It should be emphasized that the drawings herein may not be to exact scale and are schematic representations. The drawings are not intended to portray the specific parameters, materials, particular uses, or the structural details of the invention, which can be determined by one of skill in the art by examination of the information herein.

DETAILED DESCRIPTION OF THE ILLUSTRATED EMBODIMENTS

The term "wafer" is to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" in the following description, previous process steps may have been utilized to form regions or junctions in or over the base semiconductor structure or foundation. Additionally, when reference is made to a "substrate assembly" in the following description, the substrate assembly may include a wafer with layers including dielectrics and conductors, and features such as transistors, formed thereover, depending on the particular stage of processing. In addition, the semiconductor need not be silicon-based, but may be based on silicon-germanium, silicon-on-insulator, silicon-on-sapphire, germanium, or gallium arsenide, among others. Further, in the discussion and claims herein, the term "on" used with respect to two layers, one "on" the other, means at least some contact between the layers, while "over" means the layers are in close proximity, but possibly with one or more additional intervening layers such that contact is possible but not required. Neither "on" nor "over" implies any directionality as used herein. The term "about" indicates that the value listed may be somewhat altered, as long as the alteration does not result in an excessive negative impact to the process or structure. A "spacer" indicates a layer, typically dielectric, formed as a conformal layer over uneven topography then anisotropically etched to remove horizontal portions of the layer and leaving vertical portions of the layer.

Figure 1:
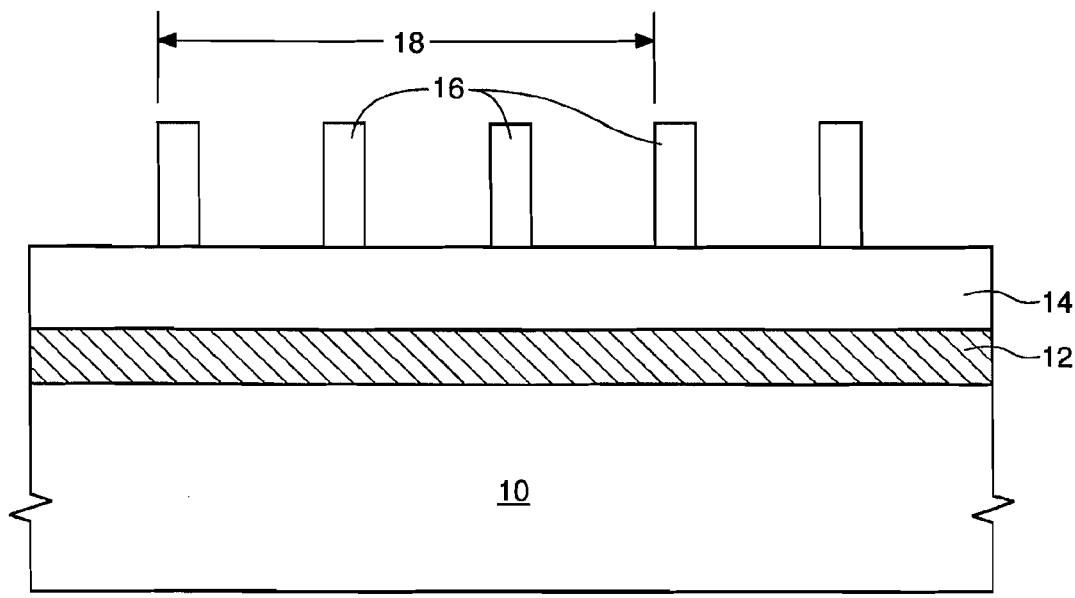
FIGS. 1-6 are cross sections depicting a conventional method for approximately doubling the density of features formed using patterned photoresist layer.
Figure 2:
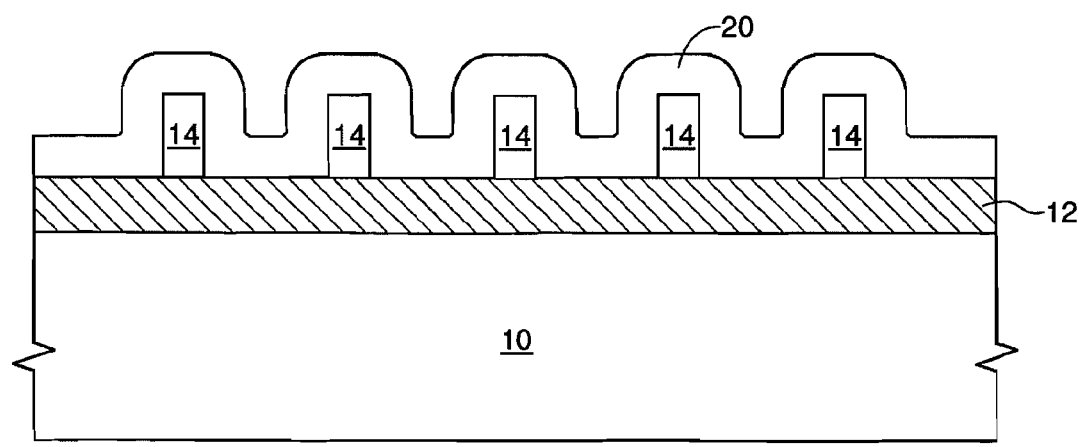
Figure 3:
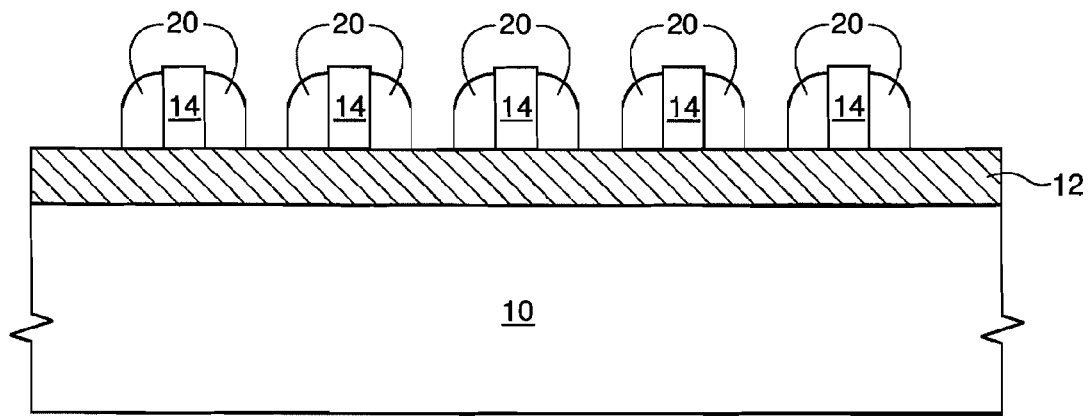
Figure 4:
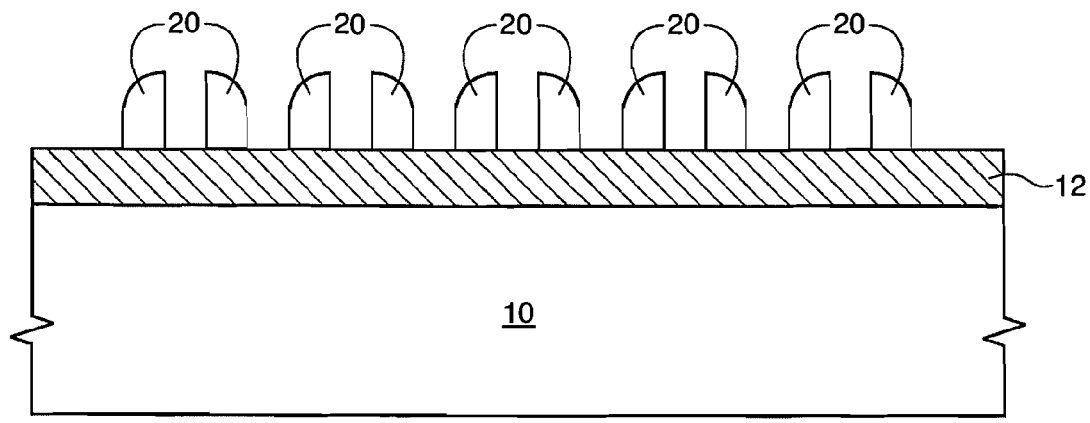
Figure 5:
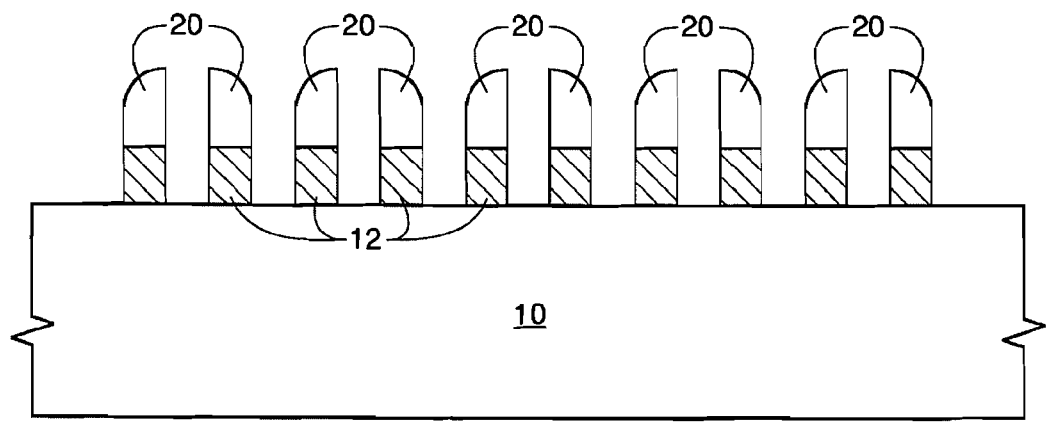
Figure 6:
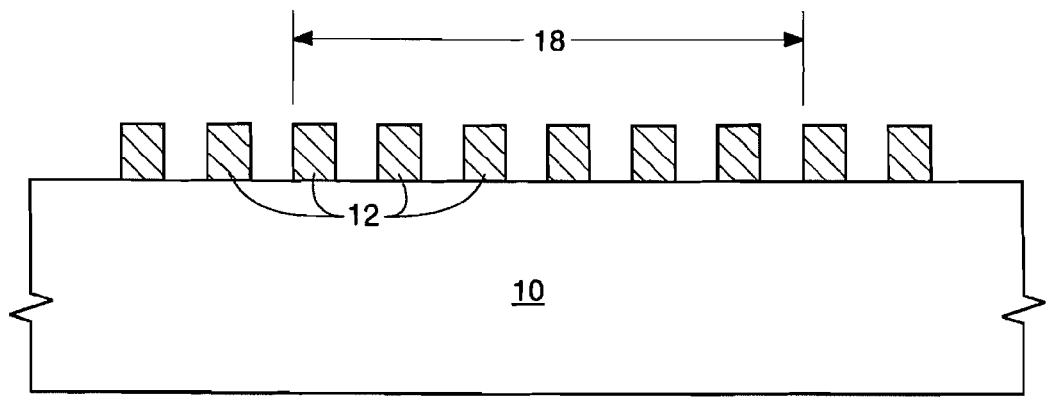
Figure 7:
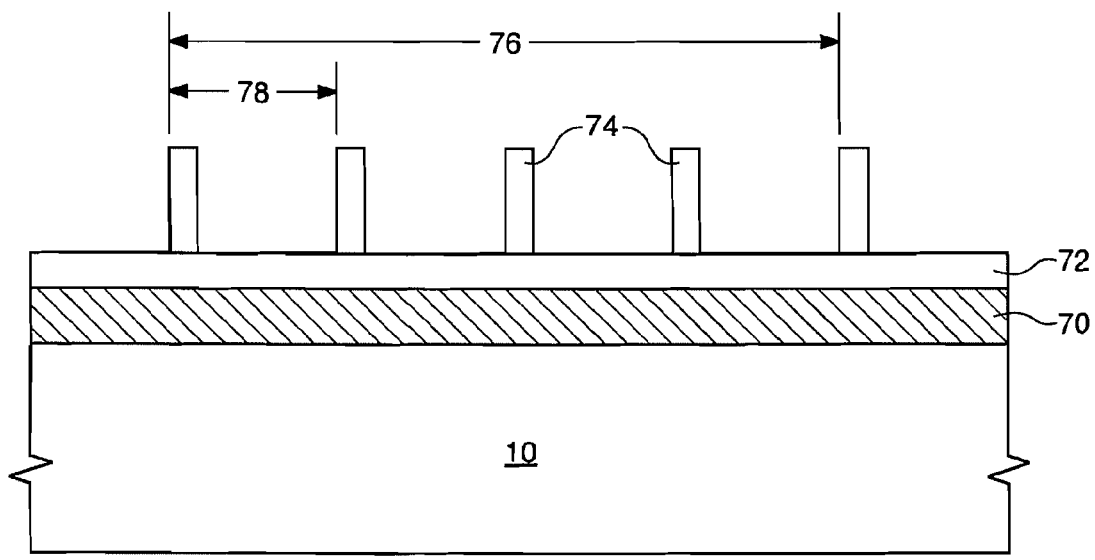
FIGS. 7-16 are cross sections depicting an exemplary embodiment of the present invention.

A first embodiment of an inventive method for manufacturing a semiconductor device is depicted in FIGS. 7-17. FIG. 7 depicts a semiconductor wafer substrate assembly 10, a bottom masking layer 70, an etch stop layer 72, and a first support layer 74, each originally formed as a blanket layer. The bottom masking layer 70 and the first support layer 74 may be formed from the same material, for example carbon, while the etch stop layer is formed from a material which resists an etch of the first support layer 74 (i.e. the first support layer may be etched selective to the etch stop layer), for example amorphous silicon (a-Si) and low silane oxide (LSO). The first support layer is sacrificial, as it will be removed prior to an etch of the bottom masking layer. FIG. 7 depicts five features formed from layer 74 in a distance 76, and includes four pitch measurements 78. Each first support layer feature comprises first and second vertically oriented sidewalls.

Carbon layers 70, 74 may be formed by chemical vapor deposition (CVD) using known techniques, for example as described in US Pat. Pub. No. 2005/0059262A1 by Yin, et al. which is assigned to Micron Technology, Inc. and incorporated herein as if set forth in its entirety. The thicknesses of carbon layers 70, 74 depend on the thickness of a material to be etched (such as silicon dioxide and silicon). In this exemplary embodiment, carbon layers 70, 74 are each about 1,000 Å thick.

An a-Si etch stop layer may be formed, for example, in a plasma enhanced CVD (PECVD) chamber to a thickness of between about 50 Å and about 800 Å by introducing silane ($SiH_4$) at a flow rate of between about 60 sccm to about 300 sccm and helium (He) at a flow rate of between about 1,000 sccm and about 3,000 sccm into the chamber. During the flow, chamber temperature is maintained to between about 150° C. and about 450° C., and chamber pressure is maintained to between about 2.0 Torr and about 6.0 Torr. An LSO etch stop layer may be formed by a plasma reaction process, for example in a PECVD chamber. Such a layer may be formed by flowing $SiH_4$ at a flow rate of between about 10 sccm and about 500 sccm, and more preferably at a flow rate of between about 50 sccm and about 200 sccm, and nitrous oxide ($N_2O$) at a flow rate of between about 300 sccm and 2,000 sccm, and more preferably at a flow rate of between about 300 sccm and about 1,000 sccm. This LSO layer may be formed at a temperature of between about 150° C. and about 600° C. for a duration of between about five seconds and about five minutes at a chamber pressure of between about one Torr and about 10 Torr.

After forming the bottom masking layer 70, etch stop layer 72, and first support layer 74, each as a blanket layer, the first support layer is masked, for example with a patterned photoresist or hard mask layer (not depicted), then etched selective to the etch stop layer 72 to result in the structure of FIG. 7. The first support layer 74 may be etched selective to the etch stop layer 72, for example using an etch comprising hydrogen bromide (HBr) at a flow rate of about 80 sccm, oxygen ($O_2$) at a flow rate of about 25 sccm, and nitrogen ($N_2$) at a flow rate of about 80 sccm. The rate of removal using this etch is about 25 Å/sec. The five remaining first support layer portions 74 each have a first width, with the distance between each adjacent first support layer portion being about five time the width of each individual first support layer portion (i.e. the feature pitch is six times the width of each individual feature). Thus for a first support layer portion having a width of about 33 nanometers (nm), the spacing between each adjacent portion will be about 165 nm and the pitch will be about 200 nm.

Figure 8:
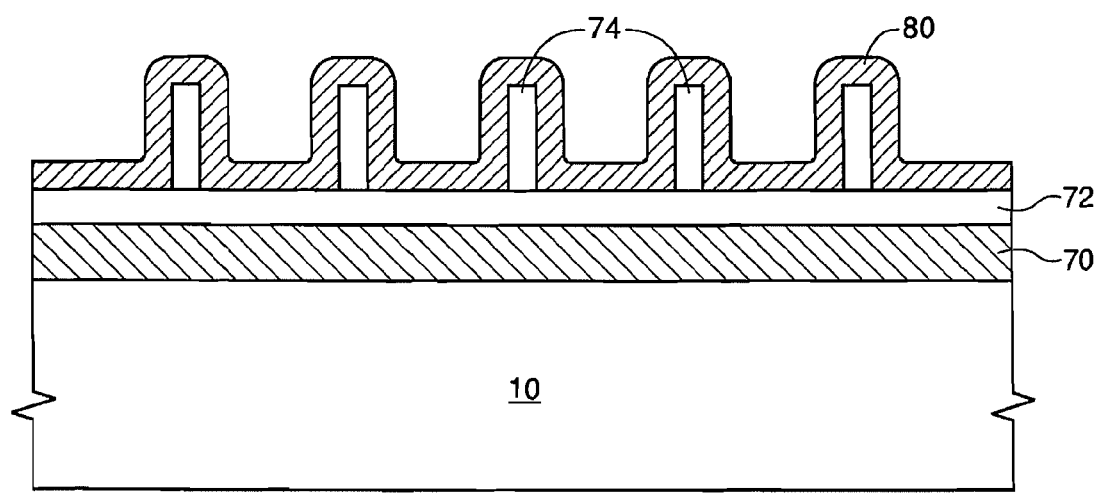

After forming the FIG. 7 structure, a conformal blanket first top masking layer 80 is formed over the first support layer 74 to result in the structure of FIG. 8. Layer 80 is formed to about the same width as first support layer 74, in the present embodiment about 33 nm, and is a material which will withstand an etch of first support layer 74 and, preferably, which may be etched selective to the material of layer 74. In this embodiment, a layer of tetraethyl orthosilicate (TEOS) would be sufficient, and may be formed by one of ordinary skill in the art.

Figure 9:
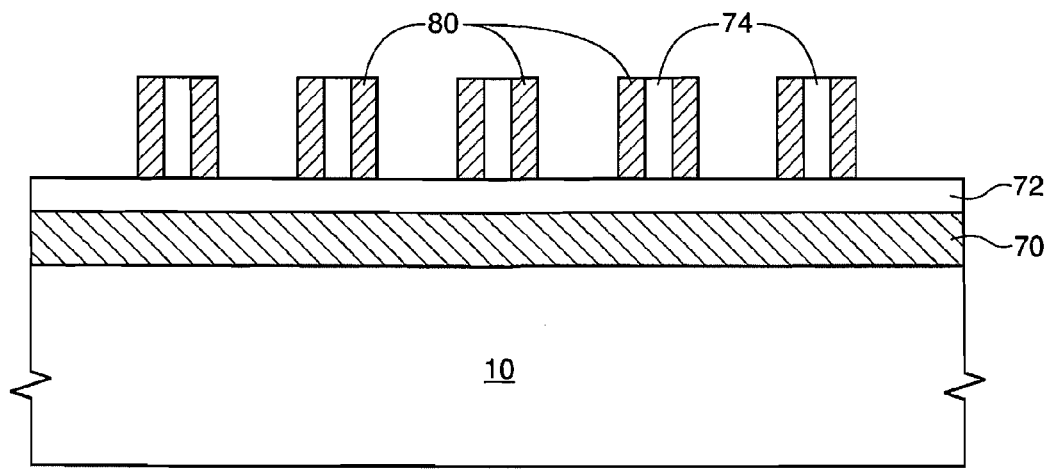

Next, the structure of FIG. 8 is subjected to a vertical etch to remove horizontally oriented portions of layer 80, while leaving vertically oriented portions. This etch, such as a TEOS spacer etch, may be performed by an artisan of ordinary skill in the art and results in the structure of FIG. 9. The spacer etch of layer 80 results in a plurality of first top masking layer spacers 80, with one spacer formed on each vertically oriented sidewall of the first support layer 74 as depicted in FIG. 9.

Figure 10:
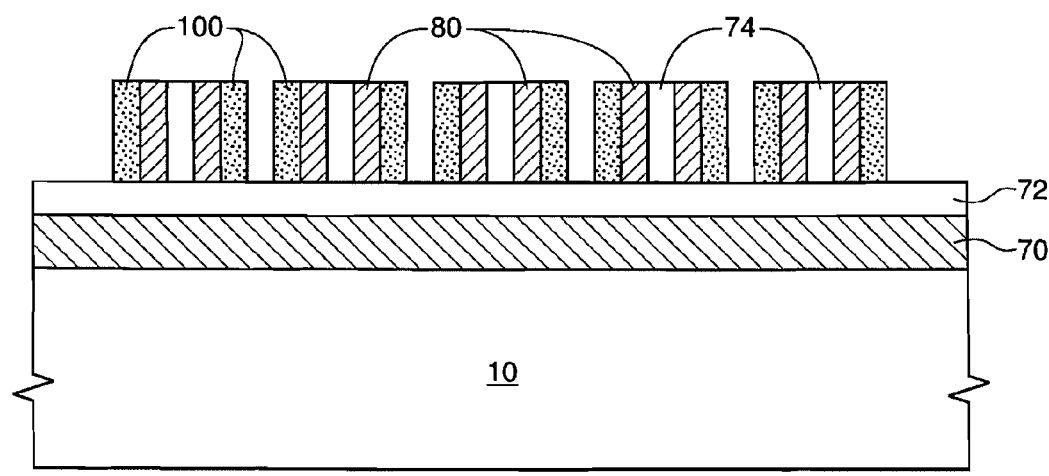

A second support layer comprising a plurality of second support layer features (spacers) 100 is formed as depicted in FIG. 10, preferably from a material which may be etched simultaneously with first support layer 74, and which may be etched selective to masking layer 80. One sufficient material is a polymer formed using a gas modulated etch (GMODE) process, which uses a plurality of periods alternating between a deposition phase and an etch phase to result in a polymer spacer along vertical topography, such as on each exposed sidewall of masking layer 80. The resulting polymer spacers are depicted at FIG. 10 as element 80. This process is known in the art, for example as discussed in U.S. Pat. No. 6,916,746 which is assigned to LAM Research Corp. of Fremont, Calif. A typical GMODE process begins by placing the semiconductor wafer substrate assembly of FIG. 9 into a chamber such as a LAM GMODE etch chamber, then a hydrocarbon, fluorocarbon, or hydrofluorocarbon gas, including but not limited to carbon tetrafluoride ($CF_4$), methyl fluoride ($CH_3F$), or hexafluorobutadiene 1,3-($C_4F_6$), is flowed into the chamber along with an optional second gas, for example hydrogen or nitrogen. Cyclic polymer deposition and etch are achieved by cyclically varying the relative ratio between etchant species and passivation species in the gas mixture. It is contemplated that during polymerization, $CF_4$ may be introduced into the chamber at a flow rate of between about 75 sccm and about 125 sccm, for example at about 100 sccm, and hydrogen may be introduced at a flow rate of between about 75 sccm and about 125 sccm, for example at about 100 sccm. During the etch phase, $CF_4$ alone may be introduced into the chamber at a flow rate of between about 175 sccm and about 225 sccm, for example at a rate of about 200 sccm. This cyclic polymerization and etch process forms the GMODE polymer at a rate of between about 1 nm/sec and about 10 nm/sec, thus the process is performed for between about 3 seconds and about 33 seconds to form a spacer layer 100 which is about 33 nm in thickness and to result in the structure of FIG. 10.

In an alternate method to form spacer 100, a conformal layer is formed, then the conformal layer is exposed to a spacer etch to remove the conformal layer from horizontal surfaces. After the etch, the structure of FIG. 10 remains, including spacer 100. With either method of formation, the second support layer 100 (as well as the first support layer 74) is sacrificial, as it will be removed prior to an etch of the bottom masking layer 70 as discussed below. Further, as depicted in FIG. 10, each second support layer feature 100 is separated from an adjacent second support layer feature by a gap.

Figure 11:
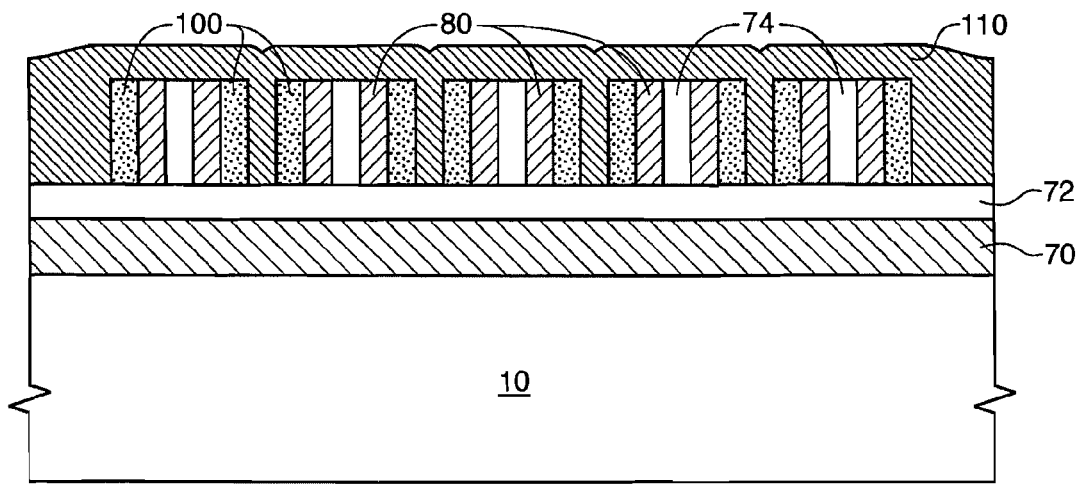

Regardless of the method of formation of spacer 100, a conformal blanket second top masking layer 110 is then formed over the FIG. 10 structure to result in the structure of FIG. 11. Layer 110 fills the remaining gaps between the vertical portions of layer 100 of FIG. 10. It is preferable that the material of the second top masking layer 110 is one which will withstand an etch of the first support layer 74 and the second support layer 100. One suitable material comprises SHB-MA001, which is a silicon-containing polymer available from Shin-Etsu Chemical Co., Ltd. of Tokyo, Japan. This layer may be deposited by spin-coating and should be sufficiently thick to planarize the surface topography.

Figure 12:
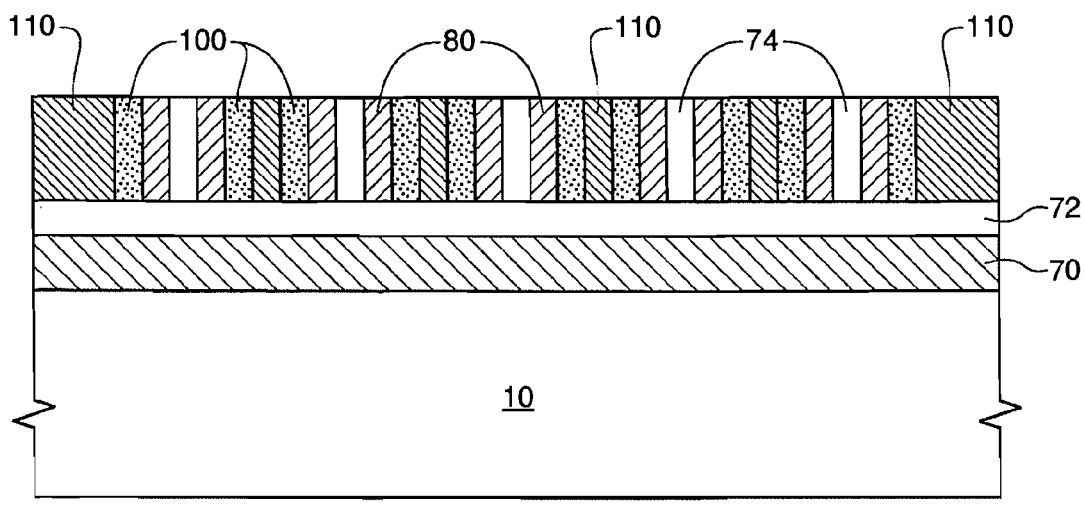

The upper portion of second top masking layer 110 of FIG. 11 is removed to result in the structure of FIG. 12. The removal may be performed through a mechanical planarization process, for example with chemical-mechanical polishing (CMP), or with a dry etch, for example using $CF_4/H_2$ gas chemistry, which may be performed by an artisan of ordinary skill in the art.

After forming the FIG. 12 structure, the first support layer 74 and the second support layer 100 are removed by etching them selective to the first top masking layer 80 and the second top masking layer 110. The first and second support layers may be etched individually with different etches or, preferably, they are removed with a single etch to minimize processing time. An etch which would remove both a carbon first support layer and a GMODE polymer second support layer selective to a TEOS first top masking layer and a spun-on polymer second top masking layer includes an oxygen plasma ashing process. After etching the first and second support layers, the structure of FIG. 13 remains.

Figure 14:
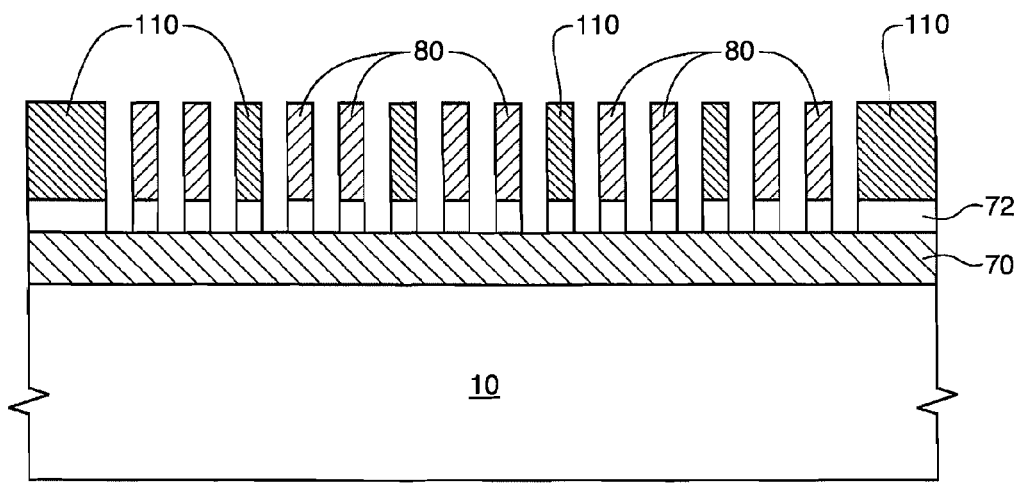

Next, the first top mask layer 80 and second top mask layer 110 are used as a patterned mask to etch the etch stop layer 72 and to result in the structure of FIG. 14. As known in the art, an a-Si etch stop layer may be etched using chlorine gas ($Cl_2$) and hydrogen bromide (HBr), and an LSO etch stop layer may be etched using $CF_4$ and $CHF_3$. Subsequently, any remaining portions of the first top mask layer 80 and the second top mask layer 110, and the etch stop layer 72 are used as a patterned mask to etch the bottom mask layer 70 to result in the FIG. 15 structure.

Next, the semiconductor wafer substrate assembly 10 is etched. During the etch, any remaining portions of the first top mask layer 80 and second top mask layer 110 may be removed, as is the etch stop layer 72 to leave just the bottom mask layer 70 remaining over the semiconductor wafer substrate assembly 10. Finally, the semiconductor wafer substrate assembly is etched using the bottom mask layer 70 as a patterned mask, and the bottom mask layer 70 is then removed, to result in the structure of FIG. 16. This process, for example, may form trenches in the semiconductor wafer to be filled with dielectric to provide shallow trench isolation (STI).

Figure 15:
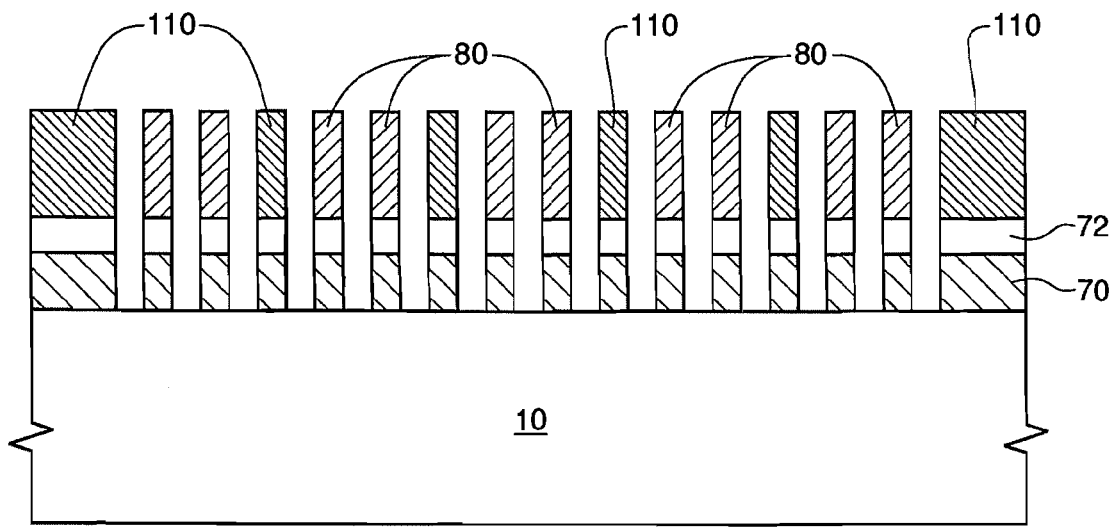

The presence of layer 70 aids the use of a trim etch of the FIG. 15 structure. This trim etch enables the formation of a narrower feature during the etch of layer 10 to form etched layer 10 depicted in FIG. 16. Depending on the design of a particular circuit, it may be preferable to omit layer 70 at FIG. 7, and to etch layer 10 of FIG. 15 using only etch stop layer 72 as a mask formed directly on layer 10 at FIG. 7. Without a trim etch, layer 70 provides limited utility.

Further, it is contemplated that the etch stop layer 72 may also be omitted. With this embodiment, the first masking layer 80 and the second masking layer 110 is formed directly on the layer to be etched. This would result in the first masking layer 80 and the second masking layer 100 of FIG. 13, for example, contacting the semiconductor wafer substrate assembly 10. Layers 80, 110 would then be used as a mask to directly etch layer 10 without intervening layers 72, 70.

Figure 16:
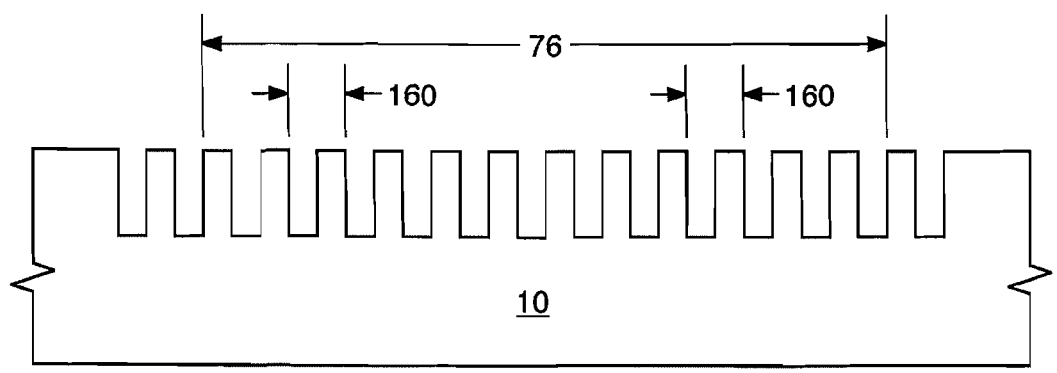

As may be determined by reviewing FIGS. 7 and 16, the process uses only a single lithography mask to form five individual portions of the first support layer 74 (FIG. 7) with four pitch measurements 78 in distance 76, but results in features totaling 12 pitch measurements 160 in the same distance 76. Thus the number of original pitch measurements from FIG. 7 is tripled in the completed structure of FIG. 16 without requiring additional photolithography. Subsequent to FIG. 7, all structures are self-aligned using conformal layers.

Figure 13:
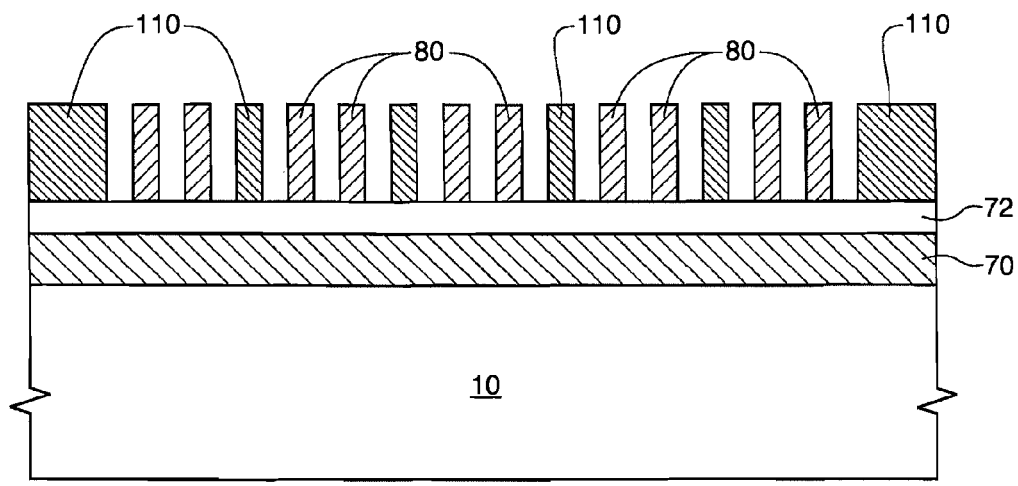

As may be determined by reviewing FIGS. 13 and 14, an inventive in-process device formed in accordance with one embodiment of the inventive method comprises a semiconductor wafer substrate assembly having a layer to be etched 10, and a mask layer overlying the layer to be etched. The mask layer comprises a plurality of cross sectional mask features having a repeating pattern. The repeating pattern in this description comprise the five leftmost mask features 80, 110. These five features, working from left to right, comprises a first pair of vertically oriented, spaced adjacent mask features 80, an unpaired vertically oriented mask feature 110, and a second pair of vertically oriented, spaced adjacent mask features 80. The first and second paired mask features 80 are formed from the same material, in one embodiment TEOS, while the unpaired mask feature 110 is formed from a different material, in one embodiment a spun-on polymer, for example SHB-MA001. As depicted, the unpaired feature 110 is interposed between the first pair of mask features and the second pair of mask features. The first pair of mask features are spaced from each other by a distance, and the second pair of mask features are spaced from each other by the distance (with some allowable processing variation). Further, as depicted, the unpaired mask feature 110 is spaced from one feature of each of the first and second paired features 80 by the distance (with some allowable processing variation).

Also, FIG. 12 depicts a first support layer 74 formed from a third material, for example carbon, which is different from the materials of the first 80 and second 110 mask features. The first support layer 74 includes a first portion interposed between the unpaired mask feature and the first pair of mask features, and a second portion interposed between the unpaired mask feature and the second pair of mask features. FIG. 12 further depicts the second support layer 100 formed from a fourth material, for example a polymer formed using a GMODE process, which is different from the first, second, and third materials. The second support layer comprises a first portion interposed between each feature of the first pair of mask features and a second portion interposed between each feature of the second pair of mask features.

The pattern depicted in FIG. 16 has three times the features of the FIG. 7 pattern for a given distance. Thus the FIG. 16 pattern has the formula 3n, where "n" is the number of features 74 depicted in a certain distance, for example in distance 76 of FIG. 7. It is contemplated that the process may be repeated with some modification on the resulting structure of one of FIGS. 13-16 to result in a pattern which is some other multiple of three, for example 6n, 9n, etc. A trim etch of the FIG. 13 structures 80, 110, or on a structure similar to layer 72 of FIG. 14, may aid in this process.

Figure 17:
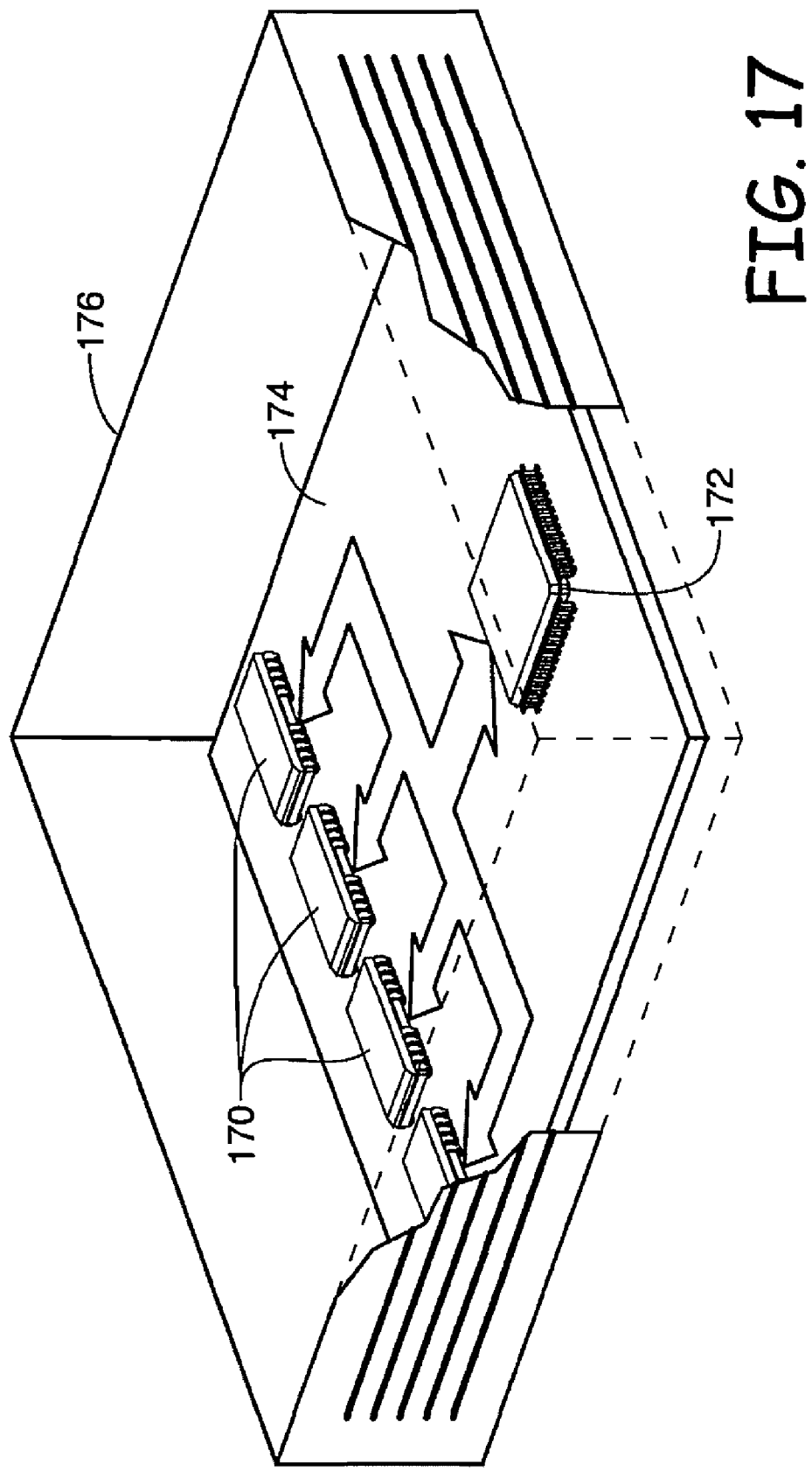
FIG. 17 is an isometric depiction of various components which may be manufactured using devices formed with an embodiment of the present invention.

As depicted in FIG. 17, a semiconductor device 170 formed in accordance with the invention may be attached along with other devices such as a microprocessor 172 to a printed circuit board 174, for example to a computer motherboard or as a part of a memory module used in a personal computer, a minicomputer, or a mainframe 176. FIG. 17 may also represent use of device 170 in other electronic devices comprising a housing 176, for example devices comprising a microprocessor 172, related to telecommunications, the automobile industry, semiconductor test and manufacturing equipment, consumer electronics, or virtually any piece of consumer or industrial electronic equipment.

Figure 18:
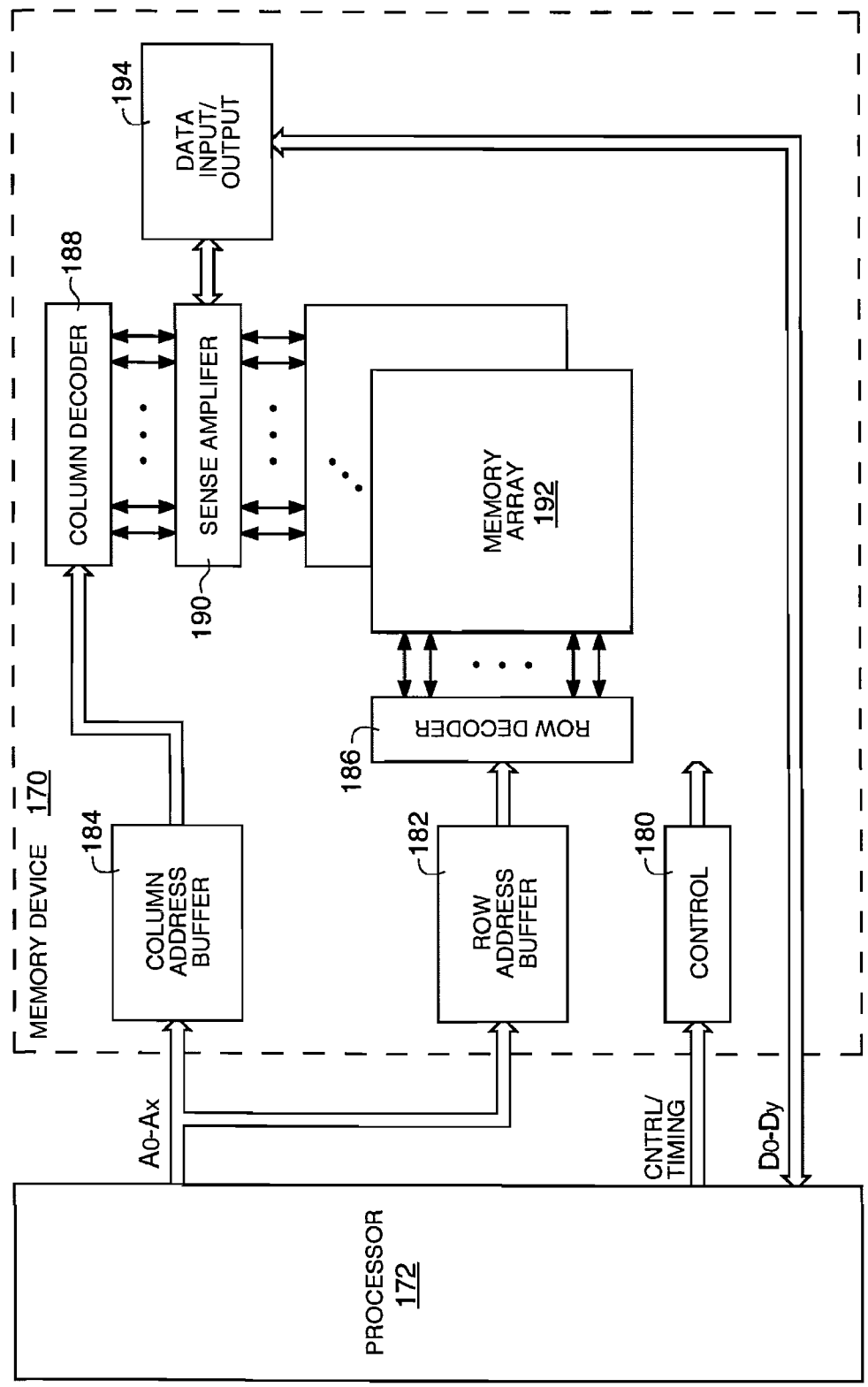
FIG. 18 is a block diagram of an exemplary use of the invention to form part of a memory device having a storage transistor array.

The process and structure described herein can be used to manufacture a number of different structures comprising a metal layer formed according to the inventive process to result in a densified metal layer having decreased resistance and reduced contamination compared with conventional layers. FIG. 18, for example, is a simplified block diagram of a memory device such as a dynamic random access memory having container capacitors and other features which may be formed using an embodiment of the present invention. The general operation of such a device is known to one skilled in the art. FIG. 18 depicts a processor 172 coupled to a memory device 170, and further depicts the following basic sections of a memory integrated circuit: control circuitry 180; row 182 and column 184 address buffers; row 186 and column 188 decoders; sense amplifiers 190; memory array 192; and data input/output 194.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A method used to form a semiconductor device, comprising:
    forming a plurality of vertically oriented first support features, wherein each feature comprises first and second sidewalls and the first support features are formed to have a first pitch;
    forming a plurality of first mask spacers, wherein one first mask spacer is formed on each first support feature sidewall, and each first mask spacer comprises an exposed, vertically oriented sidewall;
    forming a plurality of vertically oriented second support features, wherein one second support feature is formed on the exposed, vertically oriented sidewall of each first mask spacer, and each second support feature is separated from an adjacent second support feature by a gap;
    forming a plurality of second mask features, wherein one second mask feature is formed within each gap; and
    removing the first and second support features and leaving the first and second mask spacers to provide an etch pattern, wherein the first and second mask features have a second pitch, and the first pitch is about three times the second pitch.

2. The method of claim 1 further comprising:
    forming a conformal first mask layer and anisotropically etching the conformal first mask layer to form the plurality of first mask spacers;
    forming a conformal second support layer and anisotropically etching the conformal second support layer to form the plurality of vertically oriented second support features;
    depositing a blanket second mask layer into each gap, over the first support features, over the first mask spacers, and over the second support features; and
    removing the blanket second mask layer from over the first support features, from over the first mask spacers, and from over the second support features, and leaving the second mask layer within each gap.

3. The method of claim 1 further comprising:
    forming a layer to be etched;
    etching the layer to be etched using the etch pattern provided by the first and second mask spacers.

4. The method of claim 1 further comprising:
    forming an etch stop layer over a layer to be etched;
    etching the etch stop layer using the pattern provided by the first and second mask spacers to transfer the pattern into the etch stop layer; and
    etching the layer to be etched using the pattern transferred into the etch stop layer as a pattern.

5. The method of claim 1 wherein the first and second mask spacers are top mask spacers and the method further comprises:
    forming a bottom mask layer over a layer to be etched;
    etching the bottom mask layer using the pattern provided by the top first mask spacers and the top second mask spacers to transfer the pattern into the bottom mask layer;
    trim etching the bottom mask layer; and
    etching the layer to be etched using the trimmed bottom mask layer as a pattern.

* * * * *